United States Patent
Lu et al.

(10) Patent No.: US 8,000,081 B2
(45) Date of Patent: Aug. 16, 2011

(54) METHOD AND APPARATUS FOR SAFELY DECHUCKING WAFERS

(75) Inventors: Chung-Tsung Lu, Tainan (TW); Pin-Chia Su, Tainan (TW); Yu-Chih Liou, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 337 days.

(21) Appl. No.: 12/172,642

(22) Filed: Jul. 14, 2008

(65) Prior Publication Data
US 2010/0008013 A1  Jan. 14, 2010

(51) Int. Cl.
*H01L 21/683* (2006.01)
*H01T 23/00* (2006.01)

(52) U.S. Cl. ........................................... 361/234
(58) Field of Classification Search .................. 361/234
See application file for complete search history.

(56) References Cited

U.S. PATENT DOCUMENTS

| | | | | |
|---|---|---|---|---|
| 5,491,603 A | * | 2/1996 | Birang et al. | 361/234 |
| 5,790,365 A | * | 8/1998 | Shel | 361/234 |
| 6,797,639 B2 | * | 9/2004 | Carducci et al. | 438/710 |
| 7,156,951 B1 | * | 1/2007 | Gao et al. | 156/345.53 |
| 7,292,428 B2 | * | 11/2007 | Hanawa et al. | 361/234 |
| 2004/0223286 A1 | * | 11/2004 | Chu et al. | 361/234 |

* cited by examiner

*Primary Examiner* — Dharti H Patel
(74) *Attorney, Agent, or Firm* — Thomas|Kayden

(57) ABSTRACT

A wafer stage installed in a process chamber for safely dechucking a wafer is provided. In one embodiment, the wafer stage comprises: a chuck support for supporting a chuck; a chuck mounted on the chuck support for receiving and attaching a wafer thereto; a support lift means for supporting the wafer; a driving means coupled to the support lift means for gradually raising the support lift means to contact the wafer in response to a variable quantity; a sensor attached to the driving means for detecting a change in the variable quantity; and a controller for controlling the variable quantity to the driving means when a predetermined variable quantity is detected in comparison to the change in the variable quantity for a predetermined time.

21 Claims, 3 Drawing Sheets

METHOD AND APPARATUS FOR SAFELY DECHUCKING WAFERS

BACKGROUND

The present invention relates generally to apparatuses and methods for dechucking wafers from chucks, and more particularly, to apparatuses and methods for safely dechucking wafers from electrostatic chucks.

Semiconductor devices are manufactured after performing many processes such as depositing a material layer on a wafer, patterning the deposited material layer, and removing unnecessary residuals on the wafer. To perform these processes repeatedly, a wafer is loaded on a wafer stage inside a chamber, the wafer is processed, and then unloaded.

In order to successively process a wafer, it is very important to chuck and fix the wafer in the chamber and to dechuck or remove the wafer so that the wafer will not be damaged after processing. As semiconductor devices become highly integrated, the design rule becomes smaller, and the process margin becomes narrower. As a result, there is a greater need to chuck and fix the wafer without damaging the wafer during dechucking.

Methods for fixing the wafer to the wafer stage in the process chamber when the wafer is loaded on the wafer stage include using hardware structures such as clamps, using a vacuum to suction the rear side of the wafer (a vacuum chuck), using gravity, and using a piezoelectric effect. Various methods are available for dechucking the fixed wafer on the wafer stage after processing the wafer. The dechucking method used is chosen in accordance with the method used for fixing the wafer.

The most widely used method for fixing a wafer is the piezoelectric effect. In this method, an electrostatic chuck is used to fix the wafer, and the electrostatic chuck and a lifting means are used to dechuck the fixed wafer.

FIG. 1 shows a sectional view of an electrostatic chuck and a wafer thereon in a process of chucking and dechucking the wafer according to the prior art. The electrostatic chuck 25 includes an upper insulating layer 5, an electrostatic electrode 10, a lower insulating layer 15, and a lower electrode 20. The lower electrode 20 controls the reaction speed of plasma when plasma is generated in the chamber (not shown). The electrostatic electrode 10 is connected to a DC generator (not shown), and positive charges or negative charges are distributed on the electrostatic electrode 10 by the DC generator. The electric charges on the electrostatic electrode 10 induce an electrostatic field such that the wafer 35 is chucked or dechucked. Wafer 35 and the electrostatic electrode 10 are insulated by the upper insulating layer 5.

In a method for chucking the wafer 35 according to the prior art, the wafer 35 is put on the electrostatic chuck 25, and an electrostatic field is induced by supplying power to the electrostatic electrode 10 under the upper insulating layer 5 on the upper surface of the electrostatic chuck 25. Positive charges accumulate on the electrostatic electrode 10 connected to the external DC generator (not shown), and negative charges accumulate on the lower surface of the wafer 35 by plasma generated on an upper portion of the wafer 35, thereby inducing an electrostatic field between the wafer 35 and the electrostatic electrode 10. When the upper surface of the electrostatic chuck 25 is completely in contact with the wafer 35, a clamping force is produced by the electrostatic field, and thus, the wafer is chucked.

In a process for dechucking the wafer 35, the voltage supplied to the electrostatic electrode 10 and the lower electrode 20 is turned off. As a result, the electric charges flow out and the clamping force is reduced. However, since a discharge time is necessary for the charges to flow when the clamping force is reduced, the wafer 35 becomes stuck to the electrostatic chuck 25.

When lift pins 30 are raised to dechuck wafer 35 that is stuck to the electrostatic chuck 25, the force applied to the wafer 35 can easily damage and/or break the wafer 35. It is often difficult to fully and efficiently dissipate the electric charge before the lift pins are raised to dechuck wafer 35.

For these reasons and other reasons that will become apparent upon reading the following detailed description, there is a need for an improved method and apparatus for safely dechucking wafers that avoids wafer breakage associated with conventional methods and apparatuses for dechucking wafers.

SUMMARY

The present invention is directed to a wafer stage installed in a process chamber for safely dechucking a wafer. In one embodiment, the wafer stage comprises: a chuck support for supporting a chuck; a chuck mounted on the chuck support for receiving and attaching a wafer thereto; a support lift means for supporting the wafer; a driving means coupled to the support lift means for gradually raising the support lift means to contact the wafer in response to a variable quantity; a sensor attached to the driving means for detecting a change in the variable quantity; and a controller for controlling the variable quantity to the driving means when a predetermined variable quantity is detected in comparison to the change in the variable quantity for a predetermined time.

BRIEF DESCRIPTION OF THE DRAWINGS

The features, aspects, and advantages of the present invention will become more fully apparent from the following detailed description, appended claims, and accompanying drawings in which:

DETAILED DESCRIPTION

In the following description, numerous specific details are set forth to provide a thorough understanding of the present invention. However, one having an ordinary skill in the art will recognize that the invention can be practiced without these specific details. In some instances, well-known structures and processes have not been described in detail to avoid unnecessarily obscuring the present invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1:
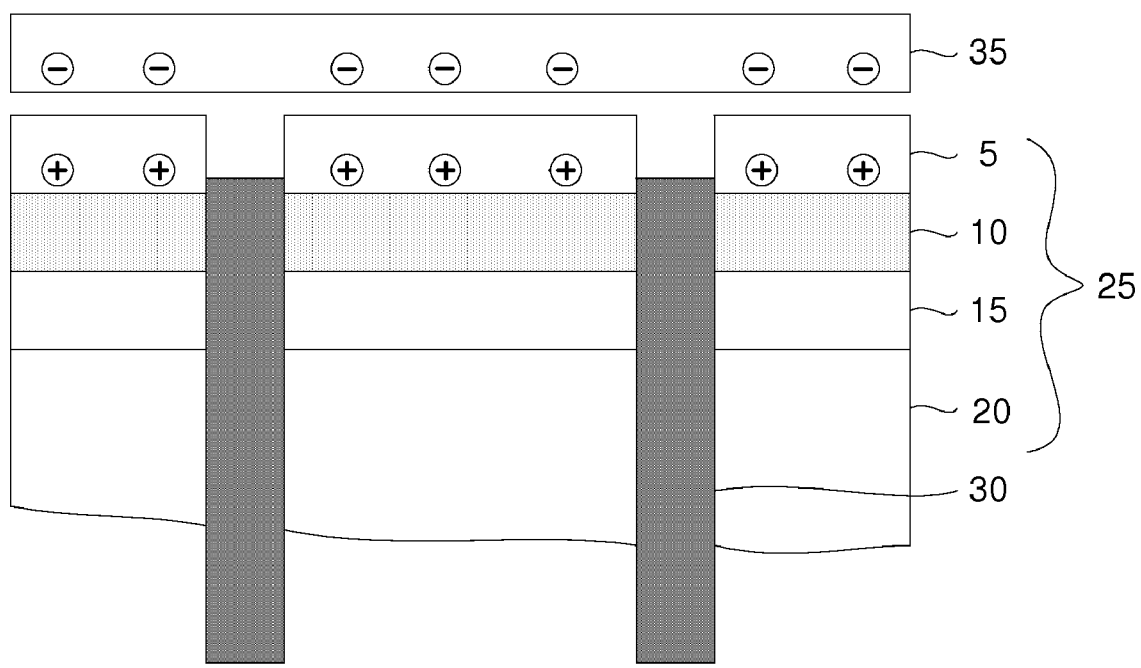
FIG. 1 shows a sectional view of an electrostatic chuck and a wafer thereon in a process of chucking and dechucking the wafer according to the prior art.
Figure 2:
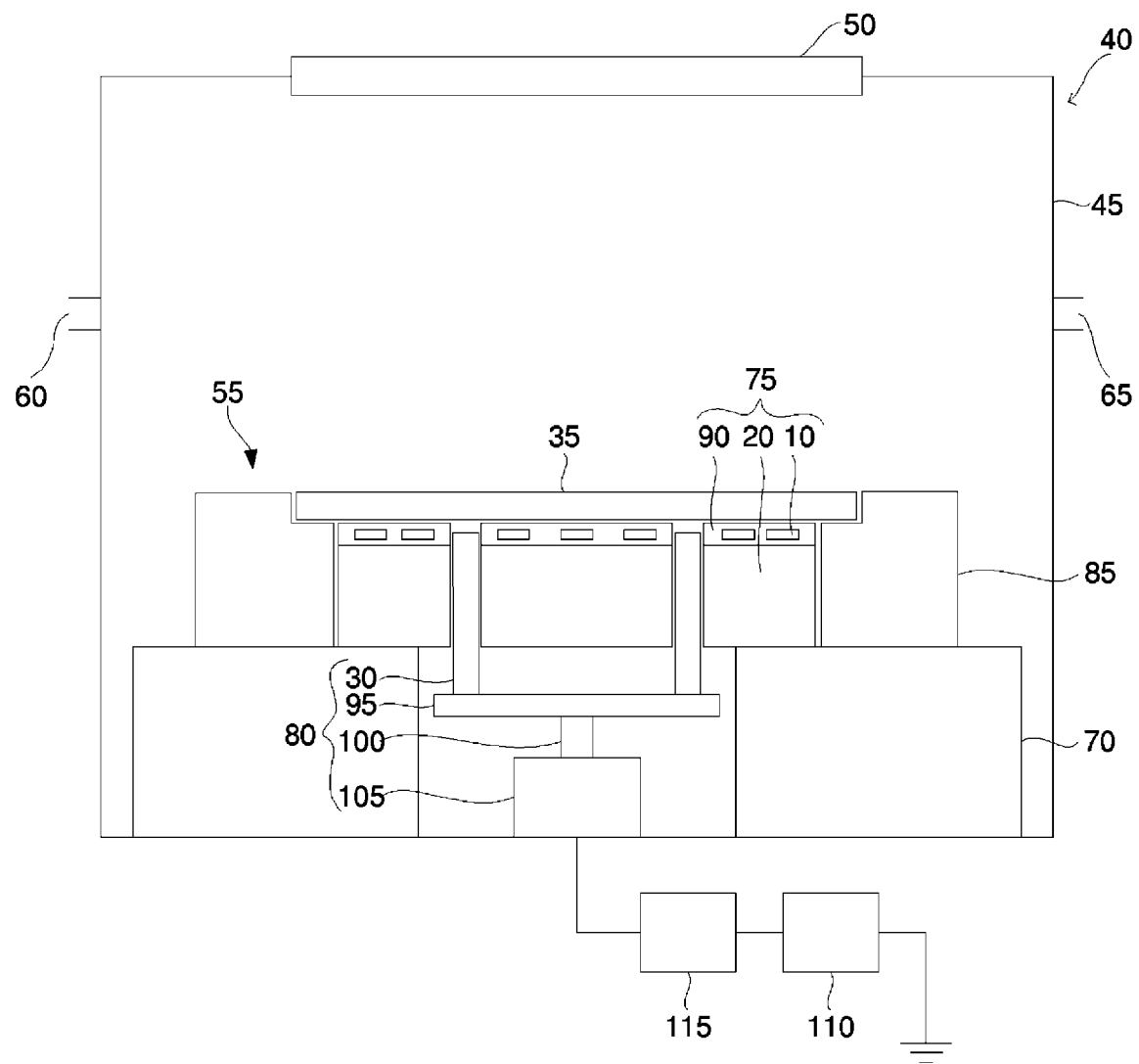
FIG. 2 is a sectional view of a wafer stage including an electrostatic chuck according to one embodiment of the present invention.

FIG. 2 is a sectional view of a wafer stage including an electrostatic chuck according to one embodiment of the present invention. A process chamber 40 includes an enclosed chamber 45 having an upper electrode 50 on an upper wall of the enclosed chamber 45, and a wafer stage 55 in the lower half of the enclosed chamber 45. A gas inlet 60 and a gas outlet 65 are located on the sidewalls of the enclosed chamber 45. During wafer processing, a reactive gas and a plasma source gas, for example, are injected into the enclosed chamber 45 via the gas inlet 60, and waste gas is exhausted through the gas outlet 65 after processing a wafer 35. The upper electrode 50 is connected to an external radio frequency (RF) generator (not shown), and power is applied to the upper electrode 50 by the RF generator. When power is applied to the upper electrode 50, the plasma source gas injected through the gas inlet 60 reacts to form plasma in the enclosed chamber 45. The process chamber 40 may, in one embodiment be a device for processing a wafer using plasma, such as a device for etching plasma.

The wafer stage 55 includes an electrostatic chuck support 70 on the bottom of the process chamber 40, an electrostatic chuck 75 on the electrostatic chuck support 70, a lifting means 80, within the electrostatic chuck 75 and the electrostatic chuck support 70, and a grounding means (not shown) for electrically grounding the lifting means 80.

The electrostatic chuck support 70 supports the electrostatic chuck 75 and a guide ring 85 and has a space where the lifting means 80 can be installed.

The electrostatic chuck 75 includes: a lower electrode 20, which is installed on top of the electrostatic chuck support 70 and is connected to an RF generator (not shown) located outside the enclosed chamber 45; an insulating flat plate 90 on an upper portion of the lower electrode 20; and a plurality of electrostatic electrodes 10, which are connected to a DC generator (not shown) located outside the enclosed chamber 45, for generating static electricity. Also, a plurality of holes inside the electrostatic chuck 75 enable lift pins 30 of the lifting means 80 to be raised or lowered. The electrostatic chuck 75 can chuck the loaded wafer 35 and safely dechuck the wafer 35 after processing.

When power is supplied to the plurality of electrostatic electrodes 10, positive or negative charges can accumulate thereon. The positive or negative charges on the plurality of electrostatic electrodes 10 induce an electrostatic field to chuck or dechuck the wafer 35. That is, when the wafer 35 is chucked, the DC generator supplies power to the plurality of electrostatic electrodes 10 such that electric charges having a charge opposite to those in the wafer 35 flow into the electrostatic electrodes 10. When the wafer 35 is dechucked, electric charges having a charge opposite to those remaining in the plurality of electrostatic electrodes 10 flow into the electrostatic electrodes 10. A direct current (DC) voltage, which is used to chuck or dechuck the wafer 35, is applied to the plurality of electrostatic electrodes 10. The detailed method for safely dechucking the wafer 35 will be described later.

The lifting means 80 includes a plurality of lift pins 30 which move up and down the holes for passing the electrostatic chuck 75, a lift pin support 95 for supporting the lift pins 30 in the electrostatic chuck support 70, a connecting axis 100 for connecting the lift pin support 95 to a driving means 105 for lifting the connecting axis 100.

The lift pins 30 are formed such that the wafer 35 can be easily lifted and stress is not concentrated on any one spot of the wafer 35 when the wafer 35 is dechucked. Preferably, the lift pins 30 are formed of a conductive material such as aluminum (Al), so that electric charge on the wafer 35 can be easily grounded when the lift pins 30 are in contact with the wafer 35.

A power source for lifting the wafer 35 is necessary to dechuck the wafer 35 from chuck 75. The driving means 105 is the device for lifting the wafer 35. The driving means 105 is coupled to the lifting means 80 for gradually raising the lifting means 80 to contact the wafer 35 in response to a variable quantity, such as for example gas, liquid, oil, etc. A pneumatic motor, hydraulic motor, electric motor, spring device, screw device, a variable load applying device such as a weight and pulley system, or other types of servomechanisms may be used for the driving means 105. A controller 110 may act as an on-off switch or a variable control valve that regulates/controls the variable quantity that goes through controller 110 and to the driving means 105. In one embodiment, where the driving means 105 is a pneumatic motor, the controller 110 receives an inflow of gas thereto and is capable of controlling the amount of gas that flows into the pneumatic motor. In another embodiment, where the driving means 105 is a hydraulic motor, the controller 110 receives an inflow of liquid and is capable of controlling the amount of liquid that flows into the hydraulic motor.

After processing the wafer 35 and in a process of dechucking the wafer 35, plasma formation stops and power supply to the electrostatic electrodes 10 is turned off. However, even though the power is cut to the electrostatic electrodes 10, residual charges remain on the wafer 35 and the upper portions of the electrostatic chuck 75 keeping the wafer 35 stuck to the chuck 75. In conventional processes, when the driving means 105 activate and raise the lift pins 30 to contact the underside of wafer 35, because the wafer 35 is stuck to the chuck 75, the wafer breaks or becomes damaged.

An aspect of the present disclosure provides a sensor 115 that is attached to the driving means 105 for detecting a change in a variable quantity. The sensor 115 may be a pressure sensor, a magnetic sensor, or an optical sensor. In one embodiment of the present disclosure, the sensor is a pressure sensor attached to a pneumatic motor for detecting a change in pressure inside the pneumatic motor in response to an inflow of gas into the motor. In another embodiment, the pressure sensor is coupled to a hydraulic motor for detecting a change in pressure inside the hydraulic motor in response to an inflow of liquid into the motor. In yet another embodiment, the sensor 115 can be pre-set to detect a maximum pressure at a predetermined time at which point the wafer 35 cannot be safely dechucked without damage thereto and the sensor may generate a signal to the controller 110 to cut off the inflow of gas/fluid to the motor and/or alert an operator. One of ordinary skill in the art understands that the sensor may be made by conventional means and be adapted to couple with the driving means 105 to detect a variable such as pressure or magnetism, for example. Another aspect of the present disclosure is that the controller 110 and the sensor 115 communicate with each other. The sensor 115 continually monitors and updates the controller 110 as to a variable, such as pressure in the driving means. According to one embodiment, where the driving means is a pneumatic or hydraulic motor, the pressure of the motor can be expressed by Equation 1.

$$P=F/A \quad \text{[Equation 1]}$$

P: pressure of the motor
F: force of the motor to raise the lift pins
A: area of the cylinder of the motor Referring to Equation 1, the pressure is proportional to the force over the area. Given a certain clamping force produced by the electrostatic field (i.e., wafer is chucked), the force of the motor and the therefore the pressure necessary to raise the lift pins can be determined to, for example, safely dechuck the wafer or to damage and/or break the wafer.

Where pressure $P_{max1}$ represents the maximum pressure at a time $T_1$ at which the wafer may be safely dechucked without damage thereto, if the sensor detects a pressure $P_1$ (the pressure at time $T_1$), where $P_1$ is greater than $P_{max1}$, the sensor 115 communicates this information to the controller 110 and the controller 110 can either cut off the inflow of gas/fluid to the motor and/or alert an operator to avoid damage to the wafer. One of ordinary skill in the art understands that the controller may be made to automatically cut off the inflow of gas/fluid to the motor and/or alert an operator. For the purpose of clarity and brevity, additional details of the controller and the sensor along with their interconnections are not illustrated or further described herein.

Where $P_1$ is less than or equal to $P_{max1}$, the sensor 115 communicates this information to the controller 110 and the controller 110 may allow an inflow of gas/fluid to the motor. At a later time $T_2$ greater than $T_1$, if the sensor detects a pressure $P_2$ (the pressure at time $T_2$) less than or equal to $P_{max2}$ (the maximum pressure at time $T_2$ at which the wafer may be safely dechucked without damage thereto), the controller may continue to allow the inflow of gas/fluid to the motor. Where the higher pressure, and therefore force eventually overcomes the clamping force existing between the wafer and the chuck, the wafer may then be dechucked safely. Where $P_2$ is greater than $P_{max2}$, the sensor 115 communicates this information to the controller 110 for the controller 110 to either cut off the inflow of gas/fluid to the motor and/or alert an operator to avoid damage to the wafer. This process may be repeated for subsequent pressures and times.

Figure 3:
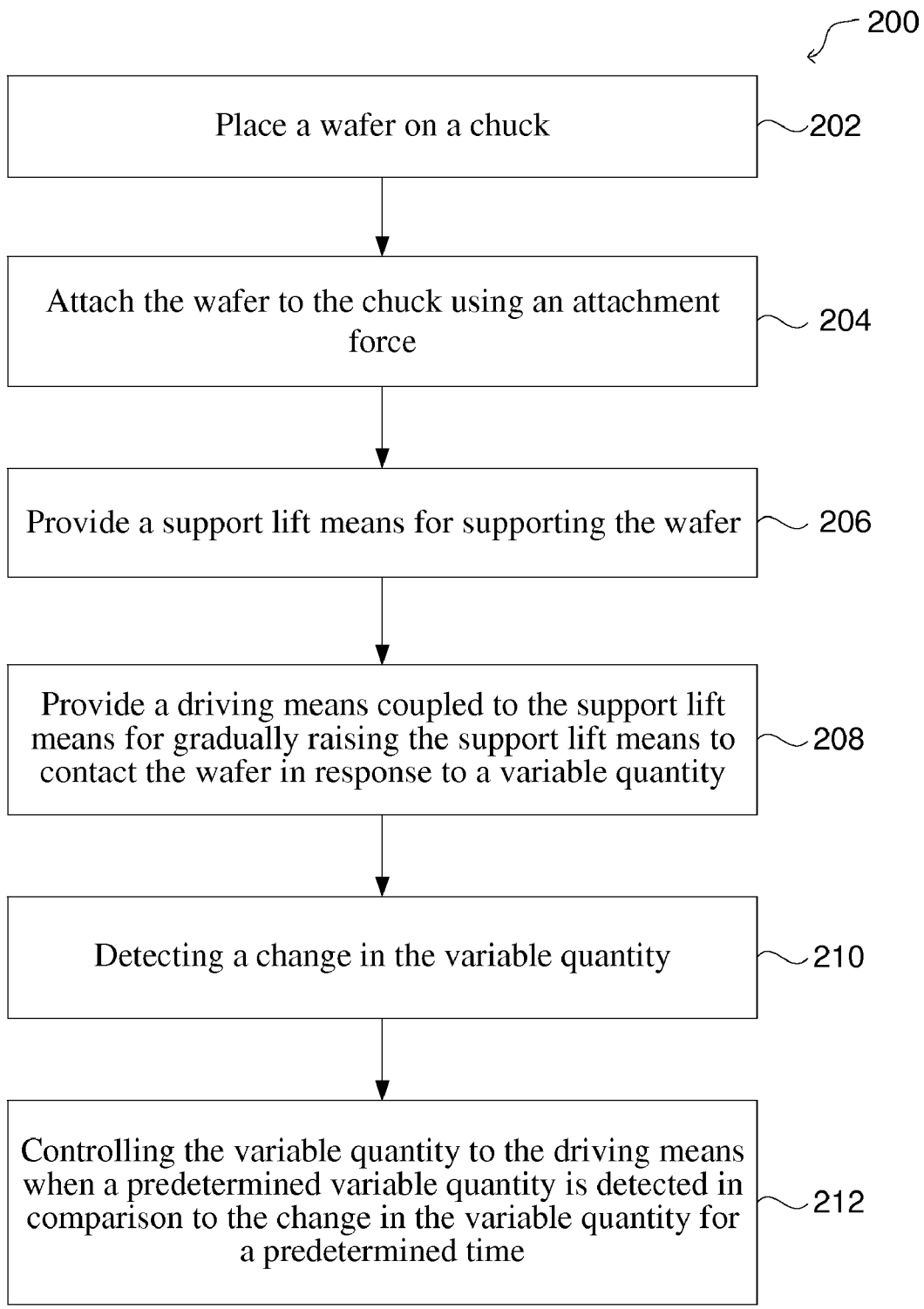
FIG. 3 is a flowchart showing a method for preventing wafer breakage according to one embodiment of the present invention.

FIG. 3 is a flowchart showing a method for preventing wafer breakage according to one embodiment of the present invention. The method 200 begins at step 202 by placing a wafer on a chuck. At step 204 the wafer is attached to the chuck using an attachment force. At step 206, a support lift means is provided for supporting the wafer. At step 208, a driving means is provided to couple to the support lift means for gradually raising the support lift means to contact the wafer in response to a variable quantity. At step 210, a change in the variable quantity is detected. At step 212, the variable quantity to the driving means is controlled when a predetermined variable quantity is detected in comparison to the change in the variable quantity for a predetermined time. Various changes, substitutions and alterations can be made in this method without departing from the spirit and scope of the present disclosure.

The present disclosure has described apparatuses and methods for safely dechucking wafers from electrostatic chucks. However, the apparatuses and methods may be utilized with other types of chucks, such as for example a vacuum chuck, and for dechucking wafers from chucks due to forces other than electrostatic forces, such as for example a vacuum force. The present disclosure has described specific exemplary embodiments. It will, however, be evident that various modifications, structures, processes, and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A wafer stage installed in a process chamber, the wafer stage comprising:
   a chuck support for supporting a chuck;
   a chuck mounted on the chuck support for receiving and attaching a wafer thereto;
   a support lift means for supporting the wafer;
   a driving means coupled to the support lift means for gradually raising the support lift means to contact the wafer in response to a variable quantity, wherein the driving means is a pneumatic motor;
   a sensor, wherein the sensor is attached to the pneumatic motor for detecting a change in pressure inside the pneumatic motor in response to an inflow of gas into the pneumatic motor; and
   a controller for controlling the variable quantity going to the driving means when a predetermined variable quantity is detected in comparison to the change in the variable quantity for a predetermined time.

2. The wafer stage of claim 1, wherein the chuck is an electrostatic chuck.

3. The wafer stage of claim 1, wherein the support lift means comprises at least one lift pin that vertically moves through at least one corresponding opening provided in the chuck.

4. The wafer stage of claim 1, wherein the controller is an on-off switch.

5. The wafer stage of claim 1, wherein the controller is adapted for outputting a signal to an operator to stop the driving means from raising the support lift means further when the sensor has detected the predetermined variable quantity.

6. A wafer stage installed in a process chamber, the wafer stage comprising:
   a chuck support for supporting a chuck;
   a chuck mounted on the chuck support for receiving and attaching a wafer thereto;
   a support lift means for supporting the wafer;
   a pneumatic driver coupled to the support lift means for gradually raising the support lift means to contact the wafer in response to an inflow of gas;
   a sensor attached to the pneumatic driver for detecting a change in pressure inside the pneumatic driver; and
   a controller coupled to the sensor, the controller for receiving an inflow of gas and being capable of controlling the inflow of gas going to the pneumatic driver when a predetermined pressure is detected in comparison to the change in pressure for a predetermined time.

7. The wafer stage of claim 6, wherein the chuck is an electrostatic chuck.

8. The wafer stage of claim 6, wherein the support lift means comprises at least one lift pin that vertically moves through at least one corresponding opening provided in the chuck.

9. The wafer stage of claim 6, wherein the controller is an on-off switch.

10. The wafer stage of claim 6, wherein the controller shuts off the inflow of gas to the pneumatic driver when the predetermined pressure is detected.

11. The wafer stage of claim 6, wherein the controller is adapted for outputting a signal to an operator to stop the pneumatic driver from raising the support lift means further when the sensor has detected the predetermined pressure.

12. A method for preventing wafer breakage, comprising:
    placing a wafer on a chuck;
    attaching the wafer to the chuck using an attachment force;
    providing a support lift means for supporting the wafer;

providing a driving means coupled to the support lift means for gradually raising the support lift means to contact the wafer in response to a variable quantity, wherein the driving means is a pneumatic motor;

detecting a change in pressure inside the pneumatic motor in response to an inflow of gas into the pneumatic motor; and controlling the variable quantity going to the driving means when a predetermined variable quantity is detected in comparison to the change in the variable quantity for a predetermined time.

13. The method of claim 12, wherein the chuck comprises an electrostatic chuck and the attachment force comprises an electrostatic force.

14. The method of claim 12, wherein the support lift means comprises at least one lift pin that vertically moves through at least one corresponding opening provided in the chuck.

15. The method of claim 12, further comprising outputting a signal to an operator to stop the driving means from raising the support lift means further when a sensor has detected the predetermined variable quantity.

16. An apparatus for preventing wafer breakages, comprising:
    a chuck support for supporting a chuck;
    a chuck mounted on the chuck support for receiving and attaching a wafer thereto;
    a support lift means for supporting the wafer;
    a driving means coupled to the support lift means for gradually raising the support lift means to contact the wafer in response to a variable quantity, wherein the driving means is a pneumatic motor;
    a sensor, wherein the sensor is attached to the pneumatic motor for detecting a change in pressure inside the pneumatic motor in response to an inflow of gas into the pneumatic motor; and
    a controller for controlling the variable quantity going to the driving means when a predetermined variable quantity is detected in comparison to the change in the variable quantity for a predetermined time.

17. The apparatus of claim 16, wherein the chuck is an electrostatic chuck.

18. The apparatus of claim 16, wherein the support lift means comprises at least one lift pin that vertically moves through at least one corresponding opening provided in the chuck.

19. The apparatus of claim 16, wherein the sensor is a pressure sensor, a magnetic sensor, or an optical sensor.

20. The apparatus of claim 16, wherein the controller is an on-off switch.

21. The apparatus of claim 16, wherein the controller is adapted for outputting a signal to an operator to stop the driving means from raising the support lift means further when the sensor has detected the predetermined variable quantity.

* * * * *